US012791576B2

(12) United States Patent
Feucht

(10) Patent No.: US 12,791,576 B2
(45) Date of Patent: Nov. 10, 2026

(54) CONTROL CIRCUIT FOR AN ACTIVE ROTATIONAL SPEED SENSOR

(71) Applicant: Knorr-Bremse Systeme Fuer Nutzfahrzeuge GmbH, Munich (DE)

(72) Inventor: Thomas Feucht, Wimsheim (DE)

(73) Assignee: KNORR-BREMSE SYSTEME FUER NUTZFAHRZEUGE GMBH, Munich (DE)

( * ) Notice: Subject to any disclaimer, the term of this patent is extended or adjusted under 35 U.S.C. 154(b) by 280 days.

(21) Appl. No.: 18/832,500

(22) PCT Filed: Dec. 27, 2022

(86) PCT No.: PCT/EP2022/087886

§ 371 (c)(1),
(2) Date: Jul. 23, 2024

(87) PCT Pub. No.: WO2023/143846

PCT Pub. Date: Aug. 3, 2023

(65) Prior Publication Data

US 2025/0110149 A1 Apr. 3, 2025

(30) Foreign Application Priority Data

Jan. 27, 2022 (DE) ..................... 10 2022 101 930.6

(51) Int. Cl.
*G01R 19/165* (2006.01)
*G01P 3/481* (2006.01)
*G01R 31/52* (2020.01)

(52) U.S. Cl.
CPC ........ *G01P 3/481* (2013.01); *G01R 19/16571* (2013.01); *G01R 31/52* (2020.01)

(58) Field of Classification Search
None
See application file for complete search history.

(56) References Cited

U.S. PATENT DOCUMENTS

2007/0274013 A1 11/2007 Gschossmann et al.
2025/0155470 A1 * 5/2025 Feucht ...................... G01P 3/44

FOREIGN PATENT DOCUMENTS

CN 101332814 B * 4/2012
CN 103018473 A 4/2013
(Continued)

OTHER PUBLICATIONS

English translation of CN101332814B (Year: 2012).*
International Search Report for PCT/EP2022/087886 dated Mar. 27, 2023.

*Primary Examiner* — Jermele M Hollington
(74) *Attorney, Agent, or Firm* — NORTON ROSE FULBRIGHT US LLP

(57) ABSTRACT

A control circuit for an active-rotational-speed-sensor (A-RSS) of a vehicle for detecting a rotational speed of a wheel and to output a sensor signal based thereon. The control circuit includes a monitoring circuit having: first and second terminals for electrically connecting the RSS and for receiving the sensor signal, and a supply terminal for connecting to a supply-voltage and a ground-terminal (GT) for connecting to a ground; a sensor signal output for providing the sensor signal from the A-RSS; a first switch to switch the first terminal to the supply terminal and a second switch to switch the second terminal to the GT; an overcurrent detector to detect an overcurrent through the supply terminal or the GT and to open the first or second switch upon detection; and a voltage controller to effect adjustment of an electrical voltage between the first terminal and the GT to a target value.

14 Claims, 5 Drawing Sheets

(56) References Cited

FOREIGN PATENT DOCUMENTS

| | | | |
|---|---|---|---|
| DE | 199 11 774 | B4 | 12/1999 |
| DE | 103 47 117 | A1 | 5/2005 |
| DE | 10 2006 037 619 | A1 | 3/2007 |
| DE | 10 2018 222 791 | A1 | 6/2019 |
| EP | 2 833 232 | B1 | 9/2020 |
| KR | 101024496 | B1 | 3/2011 |

* cited by examiner

CONTROL CIRCUIT FOR AN ACTIVE ROTATIONAL SPEED SENSOR

FIELD OF THE INVENTION

The present invention relates to a control circuit for an active rotational speed sensor and in particular to a circuit for controlling, signal processing and monitoring an active rotational speed sensor, including in particular the following: Activating and deactivating and adjusting a supply voltage, detecting an overcurrent including an automatic emergency shutdown of the rotational speed sensor.

BACKGROUND INFORMATION

Active rotational speed sensors are used in vehicles, for example, to monitor the speed of wheels for an anti-lock braking system (ABS) or other driver assistance systems in order to enable targeted intervention if a wheel speed does not correspond to a target value. Such rotational speed sensors are exposed to considerable environmental influences and must be highly reliable in continuous operation. Faults comprise, for example, short circuits to the supply voltage (e.g. battery voltage), or to ground. For these rotational speed sensors, it is also important not only to monitor the current flowing into or out of the rotational speed sensor, but also to shut down the current in good time if limit values are exceeded. However, the desired high reliability can only be ensured if damage to the active rotational speed sensor caused by such critical conditions (overcurrent, overvoltage, etc.) is safely avoided.

Specific control circuits are employed to provide the rotational speed sensor with the necessary supply voltage on the one hand, and to protect the rotational speed sensor and the downstream electronics on the other.

However, conventional control circuits do not yet offer the desired level of reliability, as the sometimes complex integrated circuits offer many sources of interference. They often cannot be used for long periods of time (e.g. more than 15 years) without faults. Furthermore, due to their complexity they are often not cost-effective to produce.

There is therefore a need for control circuits for active rotational speed sensors that allow reliable monitoring and ensure high reliability during long-term operation.

At least part of the above-mentioned problems are solved by the control circuit according to the description herein and a method for operating the control circuit according to the description herein. The further descriptions relate to further advantageous further embodiments of the subject matter of the main descriptions herein.

The present invention relates to a control circuit for an active rotational speed sensor of a vehicle. The active rotational speed sensor is configured to detect a rotational speed of a wheel and to output a sensor signal based thereon. The control circuit comprises a monitoring circuit including the following:

- a first terminal and a second terminal for the electrical connection of the rotational speed sensor and for receiving the sensor signal;
- a supply terminal for connection to a supply voltage and a ground terminal for connection to a ground;
- a sensor signal output for providing the sensor signal from the active rotational speed sensor;
- a first switch configured to switch a connection between the first terminal and the supply terminal;
- a second switch configured to switch a connection between the second terminal and the ground terminal;

- an overcurrent detector configured to detect an overcurrent through the supply terminal or through the ground terminal and to open the first switch or the second switch upon detection; and
- a voltage controller configured to effect adjustment of an electrical voltage between the first terminal and the ground terminal to a target value.

The supply voltage can be the battery voltage of the vehicle or another predetermined voltage. It is understood that switching can be either opening or closing or establishing or interrupting an electrical connection between the respective terminals. For example, the overcurrent detector can open the first switch in the event of overcurrent through the supply terminal. Alternatively or additionally, the overcurrent detector can open the second switch in the event of overcurrent to ground. When the critical overcurrent situation is over, the switch can be closed again by a specific time control (e.g. by a microcontroller). It is understood that no separate control unit or similar logic is required to actuate the switches or readjust the voltage in critical states. This is done automatically by the exemplary overcurrent detector or the voltage controller.

Optionally, the sensor signal comprises a speed signal with (at least) one pulse and an information signal with a plurality of pulses, wherein the pulses of the information signal encode information about the rotational speed sensor and have a smaller amplitude than the (at least) one pulse of the speed signal. The information about the rotational speed sensor may comprise an identification of the rotational speed sensor or indicate a current status (e.g. readiness for operation). A Manchester code, pulse width coding or other coding can be used for the coding.

Optionally, the control circuit comprises a read-out circuit having a sensor signal input connected to the sensor signal output, a speed signal output and an information signal output. In addition, the read-out circuit can have a first signal detector, which is connected to the sensor signal input and is configured to detect the speed signal and, based on this, provide a speed signal at the speed signal output. The read-out circuit may further comprise a second signal detector connected to the sensor signal input and configured to detect the information signal and provide the encoded information about the rotational speed sensor at the information signal output. The read-out circuit can also have a feedback switch which is configured to change the sensitivity of the second signal detector in response to detection of the speed signal by the first signal detector, in order to detect the information signal. For this purpose, the feedback switch can couple to the first signal detector in order to receive the trigger information for changing the sensitivity. The sensitivity can be changed or set via a reference voltage or a threshold value. The information and speed signal can be evaluated by a separate microcontroller or a control unit.

As the information signal is sent periodically with each pulse of the speed signal, it is optionally possible to determine the rotational speed redundantly via the information signal. Depending on the pole wheel, approx. 100 (or more or less) pulses of the speed signal can be sent per revolution, each followed by the information signal.

Optionally, the control circuit comprises an evaluation circuit configured to determine the rotational speed of the wheel based on the speed signal at the speed signal output. The evaluation circuit can be further configured to determine at least one piece of information or a state of the active rotational speed sensor based on the encoded information at the information signal output.

Optionally, the monitoring circuit, for independently monitoring the first terminal and/or the second terminal, comprises: a first status signal connection connected to the first terminal (directly or indirectly), and/or a second status signal connection connected to the second terminal (directly or indirectly).

Optionally, the evaluation circuit is further configured to receive signals from the first status signal connection and/or the second status signal connection in order to determine a short circuit of the first terminal and/or the second terminal and/or a crosstalk (e.g. between the first and second terminal). The short circuit may be at least one of the following: a short circuit to ground (e.g. from the first and/or the second terminal), a short circuit to supply voltage (e.g. from the first and/or the second terminal), a short circuit of the first terminal to the second terminal.

Optionally, the voltage controller comprises a current mirror for mirroring current changes due to changes in the supply voltage and injecting a mirrored current between the first switch and the first terminal to effect the voltage adjustment. The voltage adjustment can in particular be a maintenance of a predetermined voltage. According to embodiments, this is also done without a logic or a separate control unit. The circuit itself automatically adjusts the voltage to the desired level.

Optionally, the overcurrent detector comprises a first overcurrent detector for detecting a first current between the supply terminal and the first terminal, and/or a second overcurrent detector for detecting a second current between the second terminal and the ground terminal.

Optionally, the first overcurrent detector comprises a first filter to filter out overcurrent events below a fixed first minimum time duration, and to open the first switch if the fixed first minimum time duration is exceeded. The second overcurrent detector can optionally have a second filter to filter out overcurrent events below a fixed second minimum time duration, and to open the second switch if the fixed second minimum time duration is exceeded. The first minimum time duration may be the same as the second minimum time duration, or may be selected differently. According to embodiments, this is also done without a logic or a separate control unit. The minimum time durations can be permanently set in the hardware (e.g. via appropriately selected capacitors). The filters can be configured as RC elements and act as damping elements that achieve damping when detecting the overcurrent in order to implement a desired inertia.

Optionally, the first signal detector and/or the second signal detector each comprises a comparator having a reference voltage input and a sensor signal input. The reference voltage input of the second signal detector is connected to the feedback switch to change a reference voltage value at the comparator of the second signal detector in response to a detection of the speed signal by the first signal detector. The reference voltage input can, for example, be a non-inverting or an inverting input of a comparator. Accordingly, the sensor signal input can be the inverting or the non-inverting input of the comparator. If no sensor signal is present, the reference voltage values at the reference voltage inputs can have predetermined values, which in turn can be encoded in the hardware (e.g. via voltage dividers). No active components or logic are required for this.

The monitoring circuit can be a first monitoring circuit for a first rotational speed sensor. Optionally, a second monitoring circuit is also configured identically in construction to the first monitoring circuit for a second rotational speed sensor. In the same way, the read-out circuit can be a first read-out circuit, and optionally a second read-out circuit can be configured identically in construction to the first read-out circuit. The respective first signal detectors can then be configured as a first 4-channel comparator. Similarly, the respective second signal detectors can be configured as a second 4-channel comparator.

Optionally, the feedback switch comprises a transistor circuit configured to apply the reference voltage value of the comparator of the second signal detector to a center amplitude value of the pulse of the speed signal.

Further embodiments relate to an anti-lock braking system for a commercial vehicle with at least one active rotational speed sensor, wherein the system comprises a control unit with at least one of the control circuits described above. It is understood that a separate speed measurement is typically carried out for each separate wheel, so that in general several of the aforementioned control circuits can be configured. As already explained, the speed measurements can be combined in one circuit (e.g. on one circuit board) by using multi-channel comparators.

Further embodiments relate to a method of controlling and/or monitoring an active rotational speed sensor in a vehicle using a control circuit as described above.

Optionally, the method may comprise detecting a short circuit and/or a crosstalk, wherein the short circuit may be to ground or to the supply terminal, from the first terminal and/or the second terminal. To this end, the method may optionally perform at least one of the following steps:

- Input of a first signal on the first status signal connection,
- Input of a second signal on the second status signal connection,
- Analysis of a signal status on the first status signal connection,
- Analysis of a signal status on the second status signal connection,
- Comparison of a first signal status on the first status signal connection with a second signal status on the second status signal connection.

Embodiments offer the following advantages, among others: The control circuit can be manufactured cost-effectively and offers a high degree of reliability over long periods of time. No special components are used for this purpose, but standard components are used which have been proven to enable reliable operation over periods of more than 10 or more than 20 years. For example, discrete components or standard operational amplifiers are used, which can be flexibly adjusted over large areas and meet the required requirements over their entire service life.

The supply voltage and currents can be constantly monitored to provide optimum conditions for the rotational speed sensor. Separate disconnection of the supply voltage is provided on both the ground terminal side and the supply terminal side. Inputs are configured with which specific functions can be tested. Embodiments also enable adjustment of the supply voltage to specific rotational speed sensors.

The embodiments of the present invention will be better understood from the following detailed description and accompanying drawings of the various embodiments, which, however, should not be construed as limiting the disclosure to the specific embodiments, but are merely for purposes of explanation and understanding.

DETAILED DESCRIPTION

If an element is described below as "connected" or "coupled" to another element, it may be directly connected or coupled to the other element, or there may be other elements in between. In contrast, when an element is described as "directly connected" or "directly coupled" to another element, no intermediate elements are present. Other words used to describe the relationship between elements should be interpreted in the same way (e.g. "between" as opposed to "directly between", "adjacent" as opposed to "directly adjoining", etc.).

The terminology used here serves only to describe illustrative embodiments and is not to be understood as restrictive. The singular forms used herein also include the plural forms, unless the context clearly indicates otherwise. It is further understood that the terms "comprise" or "comprising", when used herein, denote the presence of certain features, steps, operations, elements and/or components, but do not exclude the presence or addition of one or more other features, steps, operations, elements, components, and/or groups thereof.

Unless otherwise defined, all terms used herein (including technical and scientific terms) have the same meaning as commonly understood by a skilled person in the field to which the examples pertain. It is further understood that terms, such as those defined in dictionaries in common use, should be interpreted to have a meaning consistent with their meaning in the context of the relevant field and should not be interpreted in an idealized or overly formal sense unless specifically so defined herein.

Finally, the formulation that elements are connected in series/parallel between two components is to be understood in the sense of an electrical circuit, namely in the sense that the relative position of the components to each other along a current direction is defined, whereby a serial connection or a parallel connection results. The word "between" should therefore not necessarily refer to the physical position or arrangement on a circuit substrate (e.g. printed circuit board).

Figure 1:
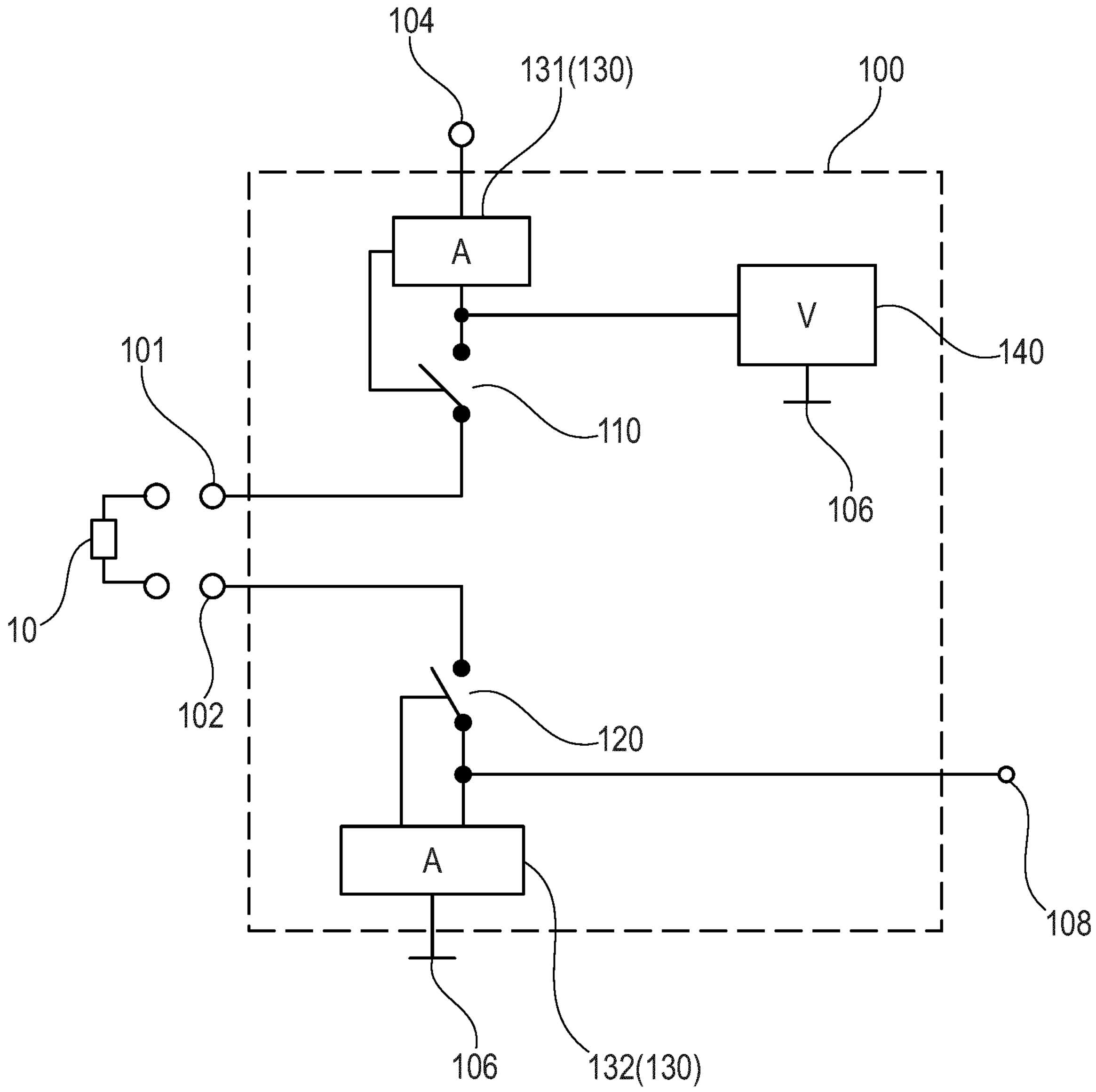
FIG. 1 shows a control circuit according to an embodiment of the present invention.

FIG. 1 shows a control circuit according to an embodiment. The control circuit comprises a monitoring circuit 100 having a first terminal 101, a second terminal 102, a supply terminal 104 and a ground terminal 106. Furthermore, the monitoring circuit comprises a sensor signal output 108, a first switch 110, a second switch 120, a first and a second overcurrent detector 131, 132 as well as a voltage controller 140. The active rotational speed sensor 10 can be connected between the first terminal 101 and the second terminal 102. However, embodiments should not be limited to the case where two independent current detectors are present, but should also comprise the case where only the first current detector 131 or only the second current detector 132 is present.

The first overcurrent detector 131 and the first switch 110 are connected in series between the supply terminal 104 and the first terminal 101. The second overcurrent detector 132 and the second switch 120 are connected in series between the ground terminal 106 and the second terminal 102. The order of the first and second switches 110, 120 or the first and second overcurrent detectors 131, 132 can also be selected differently.

At a current node between the first switch 110 and the first overcurrent detector 131, an electrical connection is provided to the voltage controller 140, which is configured to regulate a predetermined voltage at the first terminal 101. The sensor signal is tapped between the second switch 120 and the second overcurrent detector 132 and output via the sensor signal output 108.

In the present embodiment, the rotational speed sensor 10 outputs the sensor signal via the second terminal 102 (on the ground side) and can therefore be tapped via the sensor signal output 108 at the second switch 120. However, this is only an example and is not mandatory. According to further embodiments, the rotational speed sensor 10 can also output the sensor signal at the first terminal 101 (on the supply voltage side), wherein the sensor signal output 108 can then be configured upstream or downstream of the first switch 110 (e.g. at an input or output of the first overcurrent detector 131).

The first overcurrent detector 131 is configured to detect a current to/from the supply terminal 104 and to open the first switch 110 when a threshold value is exceeded. The second overcurrent detector 132 is configured to detect a current to/from the ground terminal 106 and to open the second switch 120 when a further threshold value is exceeded.

The first overcurrent detector 131 and/or the second overcurrent detector 132 optionally comprise damping circuits to actuate the first switch 110 and/or the second switch 120, respectively, only when the threshold is exceeded for a predetermined minimum time. The predetermined minimum time is set by dimensioning passive components such as capacitors and resistors, but not by a logic.

Figure 2A:
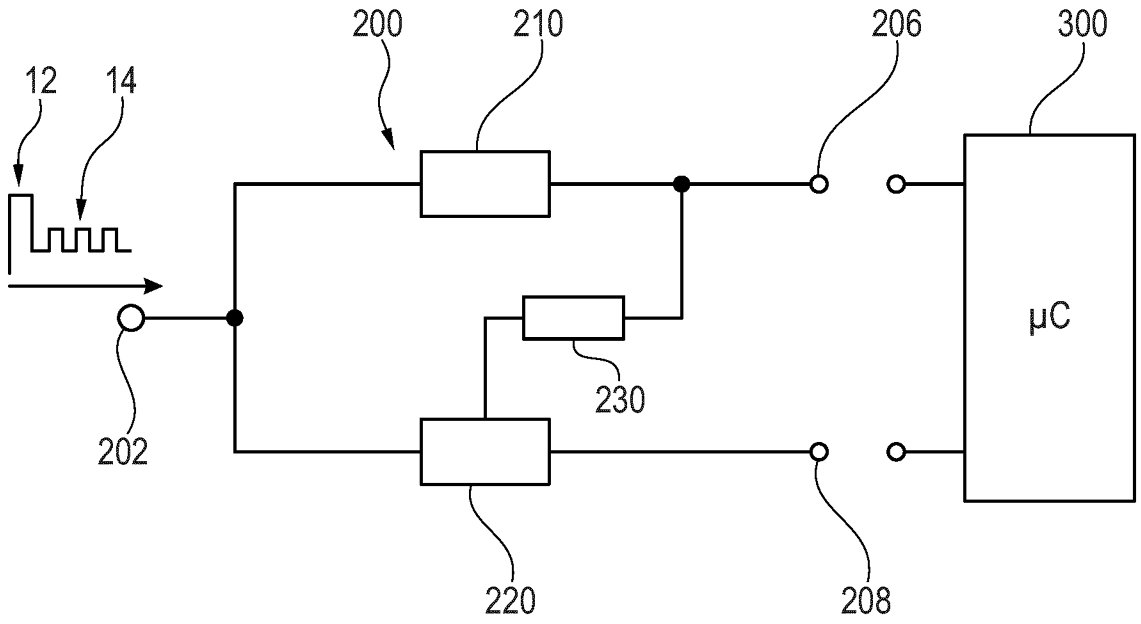
FIG. 2A shows a further optionally available circuit that can be combined with the control circuit shown in FIG. 1.
Figure 2B:
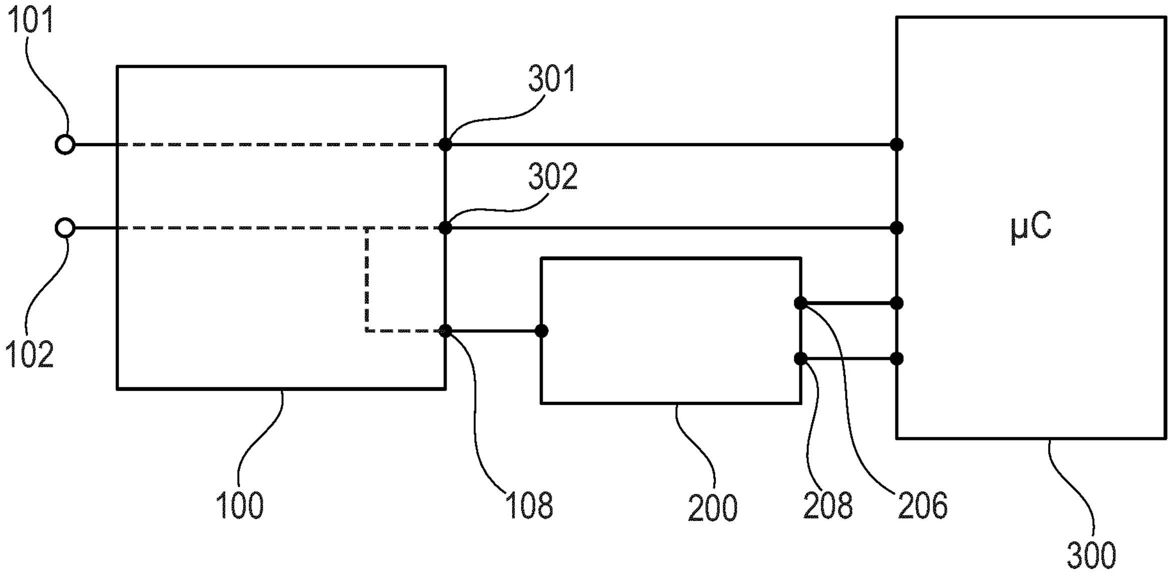
FIG. 2B shows another optionally available circuit that can be combined with the control circuit shown in FIG. 1.

FIG. 2A and FIG. 2B show further optional circuits that can be combined with the control circuit of FIG. 1 according to embodiments.

FIG. 2A shows a read-out circuit 200 according to a further embodiment. The read-out circuit 200 comprises a sensor signal input 202, a speed signal output 206 and an information signal output 208. A first signal detector 210 is configured between the sensor signal input 202 and the speed signal output 206. A second signal detector 220 is configured between the sensor signal input 202 and the information signal output 208. In addition, the read-out circuit 200 comprises a feedback switch 230 configured to change the sensitivity of the second signal detector 220 in response to an output signal from the first signal detector 210.

The speed signal output 206 and the information signal output 208 may be connected to an evaluation circuit 300 such as a microcontroller. The sensor signal input 202 may be connected to the sensor signal output 108 of the monitoring circuit 100 of FIG. 1.

During operation, a sensor signal is input via the sensor signal input 202. The sensor signal comprises a speed pulse 12 and a plurality of information pulses 14, which can repeat periodically depending on the rotational speed of the wheel. The first signal detector 210 is configured to detect the speed signal 12, for which purpose, for example, a threshold value comparison can be performed. The threshold value can be selected such that the amplitude value of the speed signal 12 is reliably detected, but not necessarily the pulses of the information signal 14.

A detection signal is provided as a speed signal at the speed signal output 206. It also serves as a trigger signal for the feedback switch 230, which changes the sensitivity of the second signal detector 220 in response. This can be done by raising the threshold value of the second signal detector 220 by the feedback switch 230, so that the second signal detector 220 can detect as many pulses as possible, including the pulse from the speed signal 12, with an equal pulse width and output them as a (binary) pulse train to the information signal output 208. The first pulse (from the speed signal 12) can then serve as a trigger pulse to decode the subsequent information signal 14 in response thereto. If the threshold of the second signal detector 220 were not raised, there would be a risk that the pulse of the speed signal 12 would be significantly wider than all other pulses due to its larger amplitude. This artificial broadening would otherwise have to be eliminated by signal post-processing in a subsequent microcontroller. Increasing the threshold value automatically solves this problem.

In this way, the subsequent evaluation circuit 300 receives the information of the presence of a speed pulse via the speed signal output 206 and can determine from the time characteristic or the number of pulses per minute how fast the wheel whose rotation is determined by the active rotational speed sensor is rotating. In addition, the evaluation circuit 300 can receive further information via the information signal output 208.

FIG. 2B shows an embodiment for a possible interconnection of the monitoring circuit 100 (see FIG. 1), the read-out circuit 200 and the evaluation circuit 300. A rotational speed sensor can again be connected to the first terminal 101 and the second terminal 102, which is supplied with a supply voltage or a current by the monitoring circuit 100 on the one hand and outputs the sensor signals received via the sensor signal output 108. The read-out circuit 200 then separates the speed signal 12 from the information signal 14 (see FIG. 2A) and forwards both signals separately to an evaluation circuit 300.

The monitoring circuit 100 in the embodiment of FIG. 2B also comprises a first status signal connection 301 and a second status signal connection 302. The first status signal connection 301 couples electrically to the first terminal 101. The second status signal connection 302 couples electrically to the second terminal 102. These inputs 301, 302 are provided for status signals so that the evaluation circuit 300 can specifically monitor the first terminal 101 and the second terminal 102 or determine whether there is a short circuit to the supply voltage or to ground by specifically controlling the connections. For example, the evaluation circuit 300 can specifically conduct voltage pulses to the connections and analyze their feedback effect on the speed signal output 206, the information signal output 208, the status signal connection 301 or status signal connection 302. The evaluation circuit 300 is therefore able to determine whether an expected result arrives at the outputs 206, 208. If this is not the case, the evaluation circuit 300 can detect an error (e.g. a short circuit).

Figure 3:
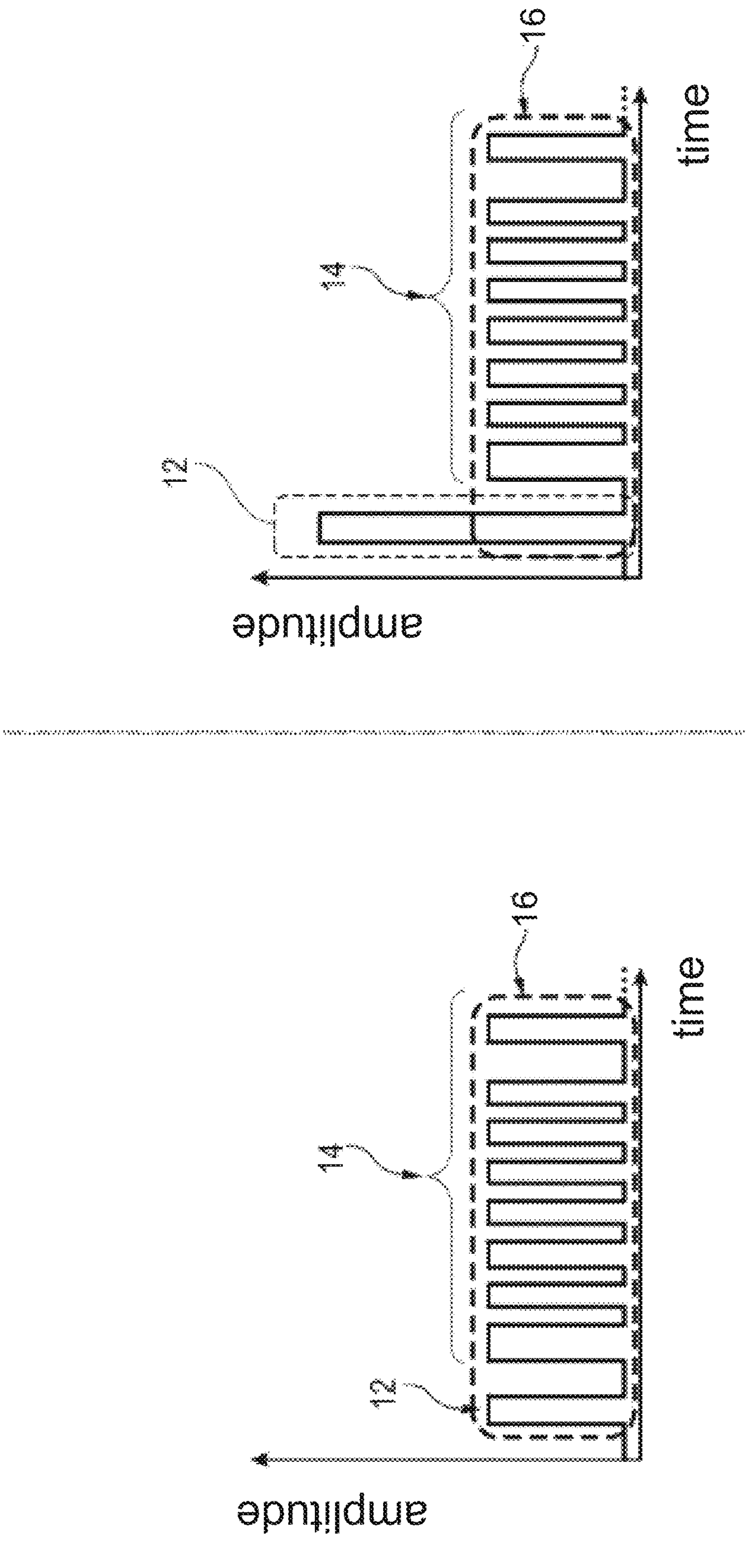
FIG. 3 shows an exemplary sensor signal of a possible active rotational speed sensor.

FIG. 3 shows an example of a sensor signal 16 as it can be output by an active rotational speed sensor 10, wherein the left-hand side shows the state of standstill or movement at very low speeds. The right-hand side shows the driving state or the state at higher speeds. A predetermined limit value (e.g. 1 km/h) can be defined to differentiate between high/low speeds.

The active rotational speed sensor 10 is configured to output a signal 16 even when the vehicle is stationary. The first pulse can be the speed signal 12, which is followed by a plurality of pulses that form the information signal 14. The signal 16 is, for example, a current signal with variable current intensity, wherein the information signal 14 can be a binary signal with two predetermined amplitude values, for example 7 mA as a low state (logical 0) or 14 mA as a high state (logical 1). For example, the speed signal 12 may have an amplitude value in the current of 28 mA in the driving state, and assume the high state when stationary. However, these values are only to be understood as examples. It is also possible that a different coding is used according to other embodiments, or that the coding depends on the specific active rotational speed sensor 10.

This signal sequence 16 repeats periodically, wherein the period is the rotational speed of the wheel, which also limits the maximum amount of information in the information signal 14. The information signal 14 can encode the status or an identification of the rotational speed sensor 10 as a binary signal. For example, a Manchester code can be used for encoding. Here, the total signal length of the information signal 14 is divided into predetermined time windows (in the case of 10-bit coding into 10 time windows), wherein a rising edge within a time window represents logic 1, and a falling edge within the time window represents logic 0.

The active rotational speed sensor 10 can, for example, be a Hall sensor or another active rotational speed sensor that can actively generate the speed signal 12 and the information signal 14 and provide them to the control circuit. An advantage of these active sensors 10 is the transmission of the additional information encoded in the information signal 14. In particular, the information signal 14 can also be transmitted when the vehicle is stationary, so that an identification of the installed rotational speed sensor 10 as well as a status of the active rotational speed sensor 10 can be determined before driving begins. The information signal 14 can be used, for example, to output various parameters of the active rotational speed sensor 10, such as whether a (correct) voltage is present, whether a predetermined electrical current is available or other electrical parameters from which the correct operation of the active rotational speed sensor can be determined.

Figure 4:
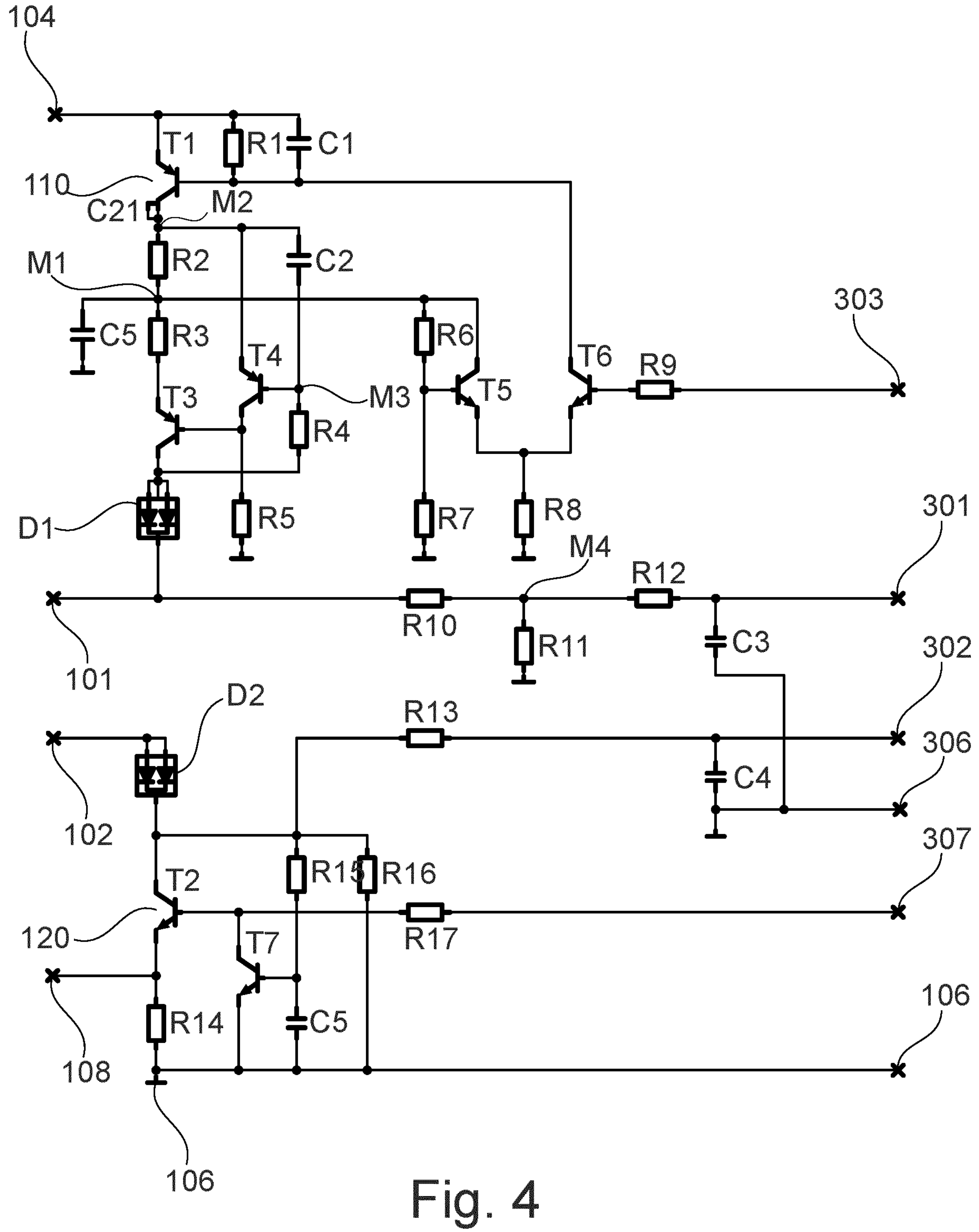
FIG. 4 shows an exemplary embodiment of the monitoring circuit with further details.

FIG. 4 shows the monitoring circuit 100 with further details according to a further embodiment. The monitoring circuit 100 comprises the following connections: the first terminal 101, the second terminal 102, the supply terminal 104, the ground terminal 106, a sensor signal output 108, a first status signal connection 301, a second status signal connection 302, an input for a first activation signal 303, an input for a second activation signal 307, a further ground terminal 306 (e.g. ground of the evaluation circuit 300).

The following elements are connected in series between the supply terminal 104 and the first terminal 101: a first transistor T1, a resistor R2, a resistor R3, a transistor T3 and a first rectifier D1. The element C21 indicates that the transistor T1 may be a power transistor with two collectors, wherein both collectors are connected to each other. The transistor T1 is connected to an emitter at the supply terminal 104. Resistors R2 and R3 are connected in series between the collector of transistor T1 and an emitter of transistor T3. A collector of the transistor T3 is connected to the first rectifier D1, which is arranged between the first terminal 101 and the transistor T3. A current node M1 between the resistors R2, R3 is connected to ground via a capacitor C5.

A resistor R1 and a capacitor C1 are connected in parallel between the supply terminal 104 and the control connection of the transistor T1. A current node M2 between the collector of the transistor T1 and the resistor R2 is connected to the collector of the transistor T3 in a series connection of a capacitor C2 and a resistor R4. In addition, the current node M2 is connected to ground 106 via a serial connection of a transistor T4 and a resistor R5, wherein the emitter of the transistor T4 couples to the current node M2. The control terminal of the transistor T4 is connected to a current node M3 between the capacitor C2 and the resistor R4. The collector of transistor T4 is also connected to the control terminal of transistor T3.

The control terminal of the transistor T1 is connected to ground 106 via a serial circuit of a transistor T6 and a resistor R8, wherein an emitter of the transistor T6 is connected to the resistor R8 and a collector of the transistor T6 is connected to the control terminal of the transistor T1. In addition, the current node M1 is connected to ground 106 in a serial connection with a transistor T5 and the resistor R8, wherein an emitter of the transistor T5 is connected to the resistor R8. The current node M1 is also connected to ground 106 via a circuit of a resistor R6 and a resistor R7. A current node between the resistor R6 and the resistor R7 is connected to a control terminal of the transistor T5. A control terminal of the transistor T6 is connected to the input of the first activation signal 303 via a resistor R9.

A resistor R10 and a resistor R12 are connected in series between the first terminal 101 and the first status signal connection 301. A current node M4 between the resistor R10 and the resistor R12 is connected to ground 106 via a resistor R11. The first status signal connection 301 is connected to the further ground terminal 306 via a capacitor C3. A second rectifier D2 and a resistor R13 are connected in series between the second terminal 102 and the second status signal connection 302. The second status signal connection 302 is connected to the further ground terminal 306 via a capacitor C4. The further ground terminal 306 can be connected to the ground terminal 106 (providing a common ground).

The second rectifier D2, a transistor T2 and a resistor R14 are connected in series between the second terminal 102 and the ground terminal 106, wherein the resistor R14 is configured between the transistor T2 and the ground terminal 106 and an emitter of the transistor T2 is electrically connected to the resistor R14. In addition, an emitter of the transistor T2 is connected to the sensor signal output 108. A collector of the transistor T2 is connected to the ground terminal 106 via a resistor R16 and, in a parallel circuit thereto, the collector of the transistor T2 is also serially connected to the ground terminal 106 via a resistor R15 and a capacitor C5. A control terminal of the transistor T2 is connected to the ground terminal 106 via a transistor T7, wherein an emitter of the transistor T7 is connected to the ground terminal 106 and a control terminal of the transistor T7 couples to a current node between the resistor R15 and the capacitor C5. In addition, the control terminal of the transistor T2 is connected to the input 307 for the second activation signal via a resistor R17.

The functions described with FIG. 1: first and second switches 110, 120, voltage controller 140, overcurrent detectors 131, 132 are fulfilled by the depicted circuit as follows:

The transistor T1 or the transistor T3 can be used as the first switch 110, which is controlled (switched) via the input 303 for the first activation signal. The first activation signal first switches the transistor T6, which then switches the transistor T1 (e.g. closes it).

The transistor T5 together with the transistor T6 forms a current mirror, which mirrors the current from the supply terminal 104 to the ground terminal 106 via the transistor T6. The voltage controller 140 is achieved via this current mirror, as the mirrored current couples at the current node M1 between the resistors R2 and R3 and increases or decreases the voltage level there accordingly, so that a dynamic readjustment of the voltage level is achieved (depending on the current through the transistor T6). The desired voltage level is set via the voltage divider with the resistors R6, R7. If, for example, the resistance value of R7 is set higher, the mirrored current through transistor T5 and therefore the voltage value at current node M1 also increase.

The transistor T4 (and similarly the transistor T7) represent the first overcurrent detector 131 (second overcurrent detector 132), which detect a current flow between the first terminal 101 and the supply terminal 104 and lead to a switch-off of the transistor T3 (or the transistor T2) when a threshold value, which is given by the resistance values or the threshold voltage of the transistors, is exceeded.

The resistor R4 and the capacitor C2 (or the resistor R15 and the capacitor C5) form an attenuator so that the transistor T4 (or T7) does not switch off immediately in the event of minor fluctuations, which would lead to the transistor T3 (or T2) opening, but only in the event of longer-lasting overcurrent events. The time constant for this is set via the capacitance of the capacitor C2 (or C5). The current flow to or from the supply terminal 104 (or to the ground terminal 106) is only switched off when the (time) threshold value thus defined is exceeded.

On the ground side (so-called "low side"), the transistor T2 fulfills the function of the second switch 120, which is switched via the input 307 for the second activation signal. As already mentioned, the transistor T7 fulfills the function of the second overcurrent detector 132, which causes a switch-off on the ground side if the current flow and thus the voltage drop across the resistor R14 become too high, which causes the potential at the control terminal of the transistor T7 to rise above a threshold value.

The first rectifier D1 and the second rectifier D2 can be configured by diodes connected in parallel (e.g. to allow a high current at low resistance), and ensure that a rectified current flow to/from the active rotational speed sensor is achieved.

The resistor R12 and the capacitor C3 form a filter (low pass) to divert high frequency components to the further ground terminal 306. Similarly, the resistor R13 and the capacitor C4 form a filter (low-pass) to divert high-frequency components at the second terminal 102 to the further ground terminal 306.

Figure 5:
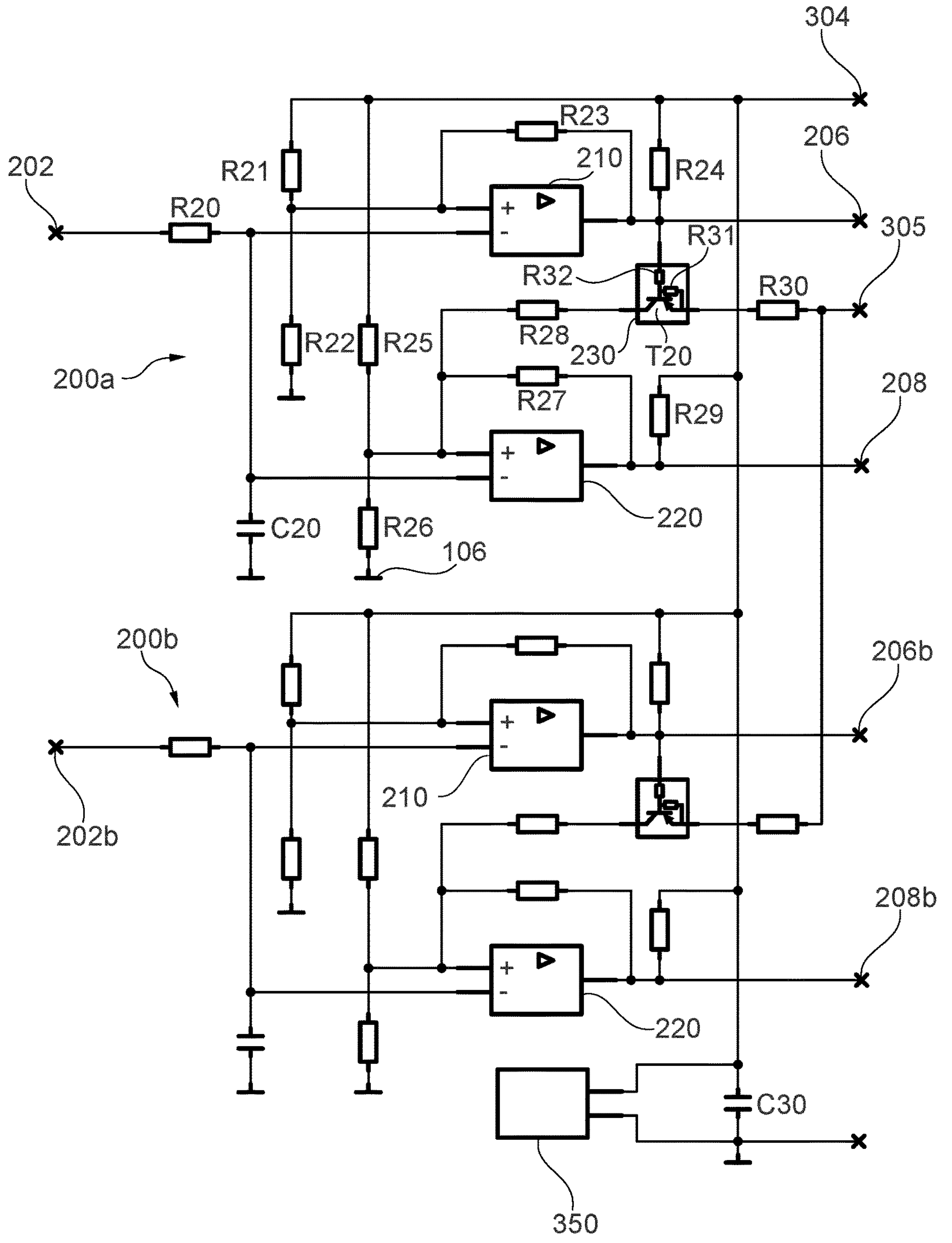
FIG. 5 shows an exemplary embodiment of the read-out circuit with further details.

FIG. 5 shows the read-out circuit 200 with further details according to a further embodiment. The read-out circuit 200 comprises a first read-out circuit 200*a* and a second read-out circuit 200*b*, which are arranged in mirror symmetry in order to be able to read out speed signals from two wheels simultaneously.

The first read-out circuit 200*a* shown above in FIG. 5 comprises: the sensor signal input 202, a first power supply 304, the speed signal output 206, a second power supply 305, the information signal output 208, and the ground terminal 106. The first power supply 304 and the second power supply 305 may be at a same potential (electrically connected to each other), for example, but may be configured by different connections in the circuit to apply different potentials. The first signal detector 210 is connected between the sensor signal input 202 and the speed signal output 206, wherein a resistor R20 is also configured between the first signal detector 210 and the sensor signal input 202. The first signal detector 210 is exemplarily formed by a first comparator with an inverted input (−) and a non-inverted input (+), wherein the inverted input (−) is connected to the sensor signal input 202 via the resistor R20 and the output of the comparator 210 is connected to the speed signal output 206. The inverted input (−) of the first comparator 210 is furthermore connected to the ground terminal 106 via a capacitor C20.

The non-inverted input (+) of the first comparator 210 is electrically connected to the first power supply 304 via a resistor R21 and to the ground terminal 106 via a resistor R22. In addition, the output of the first comparator 210 is electrically connected to the non-inverted input (+) via a resistor R23.

The sensor signal input 206 is furthermore electrically connected in series to the information signal output 208 via the resistor R20 and the second signal detector 220. The second signal detector 220 may also be configured as a second comparator having an inverted input (−) and a non-inverted input (+). The non-inverted input (+) of the second comparator 220 is electrically connected to the output of the second comparator 220 via a resistor R27. In addition, the non-inverted input (+) of the second comparator 220 is connected to the first power supply 304 via a resistor R25, and to the ground terminal 106 via a resistor R26.

The output of the second signal detector 220 is connected to the first power supply 304 via a resistor R29.

The feedback switch 230 is configured as a transistor circuit and comprises, for example, a transistor T20, wherein an emitter of the transistor T20 is connected to the second power supply 305 via a resistor R30 and the collector of the transistor T20 is connected to the non-inverted input (+) of the second comparator 220 via a resistor R28. The control terminal of the transistor T20 is connected to the output of the first comparator 210 via a resistor R32. The control terminal of the transistor T20 is also electrically connected to the emitter of the transistor T20 via a resistor R31.

The second read-out circuit 200*b* shown below in FIG. 5 is constructed in the same way as the first read-out circuit 200*a*. Since the second read-out circuit 220*b* is provided for detecting the speed of a different wheel, the following connections are configured separately: the sensor signal input 202*b*, the speed signal output 206*b* and the information signal output 208*b*. The other connections are interconnected according to the embodiment shown, i.e. both read-out circuits share the first power supply 304 and the second power supply 305 and the ground terminal 106.

According to further embodiments, the respective first signal detectors 210 are configured as a first 4-channel comparator 210. Similarly, the respective second signal detectors may be configured as a second 4-channel comparator 220. In this way, the circuits can be implemented in a compact manner. According to further embodiments, the first comparator 210 is configured together with the second comparator 220 as a 4-channel comparator, for example as a 2-channel evaluation circuit.

According to further embodiments, a supply unit 350 is provided for a power supply of the comparators, which has two connections, one of which is connected to the first power supply 304 and a second of which is connected to the ground terminal 106. Both connections are also connected to each other via a capacitor C30, for example in order to filter high-frequency components.

The functions described for FIG. 2A are implemented in this embodiment as follows. The function of the read-out circuit 200 is to separate the speed signal 12 from the information signal 14, which is implemented by adjustment of the threshold values for detection and can be described as follows.

The first comparator 210 and the second comparator 220 each compare the sensor signal at the sensor signal input 202 with respective reference values (threshold values) at the non-inverted inputs (+) of the comparators 210, 220. The reference value at the first comparator 210 can be selected so that it reliably detects the speed signal 12, but not the information signals 14. Therefore, only the pulses of the speed signal 12 can be output at the sensor signal output 206, from the frequency of which the rotational speed of the wheel can be determined (for example, one pulse or 100 pulses occur for each revolution). When this pulse is present, the transistor T20 switches the connection of the non-inverted input (+) of the second comparator 220 to the second voltage supply 305. As a result, the reference voltage at the second comparator 220 is changed when the speed pulse 12 is present.

The reference voltage at the second comparator 220 may be selected before changing so that the second comparator 220 can reliably detect all pulses of the information signal 14 and output the information signal 14 accordingly. However, the pulse of the speed signal 12 is higher, and the capacitor C20 may cause the speed pulse 12 to be widened at the level of the pulses of the information signal 14, and only above this level have an equal pulse width as the pulses of the information signal 14. In order to achieve the same pulse width for all pulses, the feedback switch 230 causes the reference voltage at the second comparator 220 to be raised during the pulse of the speed signal 12, so that detection takes place at a value where the speed pulse 12 ideally has the same width as the pulses of the information signal 14. This "height shift" is controlled by the selection of the resistors R28, R30. As a result, all pulses are detected with the same pulse width. The evaluation then takes place in the evaluation circuit 300.

The features of the invention disclosed in the description, the claims and the Figures may be essential for the realization of the invention either individually or in any combination.

THE LIST OF REFERENCE SYMBOLS IS AS FOLLOWS

10 (active) rotational speed sensor
12 speed signal
14 information signal
100 monitoring circuit
101, 102 first connection, second terminal
104 supply terminal
106, 306 ground terminals
108 sensor signal output
110 first switch
120 second switch
130, 131, 132 overcurrent detector(s)
140 voltage controller
200 readout circuit
202 sensor signal input
206 speed signal output
208 information signal output
210 first signal detector
220 second signal detector
230 feedback switch
300 evaluation circuit
301, 302 status signal connections

303, 307 inputs for activation signals
304 first power supply
305 second power supply
350 setting unit for the supply voltage
R1, R2, . . . various resistors
C1, C2, . . . various capacitors
D1, D2, . . . rectifier
T1, T2, . . . various transistors

The invention claimed is:

1. A control circuit for an active rotational speed sensor of a vehicle, the active rotational speed sensor being configured to detect a rotational speed of a wheel and to output a sensor signal based thereon, comprising:

a monitoring circuit, including:

a first terminal and a second terminal for an electrical connection of the rotational speed sensor and for receiving the sensor signal;

a supply terminal for connection to a supply voltage of the vehicle and a ground terminal for connection to a ground;

a sensor signal output for providing the sensor signal from the active rotational speed sensor;

a first switch configured to switch the first terminal with the supply terminal;

a second switch configured to switch the second terminal with the ground terminal;

an overcurrent detector configured to detect an overcurrent through the supply terminal or through the ground terminal and, upon detection, to open the first switch or the second switch; and a voltage controller configured to effect adjustment of an electrical voltage between the first terminal and the ground terminal to a target value.

2. The control circuit of claim 1, wherein the sensor signal includes a speed signal with one pulse and an information signal with a plurality of pulses, wherein the pulses of the information signal encode information about the rotational speed sensor and have a smaller amplitude than the speed signal, further comprising:

a read-out circuit, including:

a sensor signal input connected to the sensor signal output;

a speed signal output and an information signal output;

a first signal detector, which is connected to the sensor signal input and which is configured to detect the speed signal and provide a speed signal at the speed signal output based thereon;

a second signal detector connected to the sensor signal input and configured to detect the information signal and provide the encoded information about the rotational speed sensor at the information signal output; and a feedback switch configured to change a sensitivity of the second signal detector in response to a detection of the speed signal by the first signal detector for detecting the information signal.

3. The control circuit of claim 2, further comprising:

an evaluation circuit which is configured to determine the rotational speed of the wheel based on the speed signal at the speed signal output, and to determine at least one piece of information or a state of the active rotational speed sensor based on the encoded information at the information signal output.

4. The control circuit of claim 1, wherein the monitoring circuit for independently monitoring the first terminal and the second terminal includes:

a first status signal connection connected to the first terminal, and/or a second status signal connection connected to the second terminal.

5. The control circuit of claim 4, further comprising:

an evaluation circuit which is configured to determine the rotational speed of the wheel based on the speed signal at the speed signal output, and to determine at least one piece of information or a state of the active rotational speed sensor based on the encoded information at the information signal output;

wherein the evaluation circuit is further configured to receive signals from the first status signal connection and the second status signal connection to determine a short circuit of the first terminal and/or the second terminal or a crosstalk, wherein the short circuit is at least one of the following: a short circuit to ground, a short circuit to the supply voltage, a short circuit of the first terminal to the second terminal.

6. The control circuit of claim 1, wherein the voltage controller includes a current mirror to mirror current changes due to changes in the supply voltage and to inject a mirrored current between the first switch and the first terminal to effect the voltage adjustment.

7. The control circuit of claim 1, wherein the overcurrent detector includes:

a first overcurrent detector for detecting a first current between the supply terminal and the first terminal, and/or a second overcurrent detector for detecting a second current between the second terminal and the ground terminal.

8. The control circuit of claim 7, wherein the first overcurrent detector includes a first filter to filter out overcurrent events below a fixed first minimum time duration, and to open the first switch when the fixed first minimum time duration is exceeded, and/or wherein the second overcurrent detector has a second filter to filter out overcurrent events below a fixed second minimum time duration, and to open the second switch when the fixed second minimum time duration is exceeded.

9. The control circuit of claim 2, wherein the first signal detector and the second signal detector each have a comparator with a reference voltage input and a sensor signal input, and wherein the reference voltage input of the second signal detector is connected to the feedback switch to change a reference voltage value at the comparator of the second signal detector in response to a detection of the speed signal by the first signal detector.

10. The control circuit of claim 9, wherein the monitoring circuit includes a first monitoring circuit for a first rotational speed sensor, and a second monitoring circuit is configured identically to the first monitoring circuit for a second rotational speed sensor, and wherein the read-out circuit includes a first read-out circuit, and a second read-out circuit is configured identically in construction to the first read-out circuit, and wherein the respective first signal detectors are configured as a first 4-channel comparator, and/or the respective second signal detectors are configured as a second 4-channel comparator, and/or the first signal detector and the second signal detector of a respective read-out circuit are configured as a 4-channel comparator.

11. The control circuit of claim 9, wherein the feedback switch includes a transistor circuit configured to apply the reference voltage value of the comparator of the second signal detector to an amplitude value of the speed signal, so that the second signal detector detects all pulses as far as possible with the same pulse width.

12. An anti-lock braking system for a commercial vehicle with at least one active rotational speed sensor, comprising:

a control device having at least one control circuit, wherein each control circuit is for each active rotational speed sensor of the vehicle, the active rotational speed sensor being configured to detect a rotational speed of a wheel and to output a sensor signal based thereon, including:

a monitoring circuit, including:

a first terminal and a second terminal for an electrical connection of the rotational speed sensor and for receiving the sensor signal;

a supply terminal for connection to a supply voltage of the vehicle and a ground terminal for connection to a ground;

a sensor signal output for providing the sensor signal from the active rotational speed sensor;

a first switch configured to switch the first terminal with the supply terminal;

a second switch configured to switch the second terminal with the ground terminal;

an overcurrent detector configured to detect an overcurrent through the supply terminal or through the ground terminal and, upon detection, to open the first switch or the second switch; and a voltage controller configured to effect adjustment of an electrical voltage between the first terminal and the ground terminal to a target value.

13. A method, the method comprising:

controlling and monitoring an active rotational speed sensor of a vehicle using a control circuit;

wherein the control circuit is for the active rotational speed sensor of the vehicle, the active rotational speed sensor being configured to detect a rotational speed of a wheel and to output a sensor signal based thereon, including:

a monitoring circuit, including:

a first terminal and a second terminal for an electrical connection of the rotational speed sensor and for receiving the sensor signal;

a supply terminal for connection to a supply voltage of the vehicle and a ground terminal for connection to a ground;

a sensor signal output for providing the sensor signal from the active rotational speed sensor;

a first switch configured to switch the first terminal with the supply terminal;

a second switch configured to switch the second terminal with the ground terminal;

an overcurrent detector configured to detect an overcurrent through the supply terminal or through the ground terminal and, upon detection, to open the first switch or the second switch; and a voltage controller configured to effect adjustment of an electrical voltage between the first terminal and the ground terminal to a target value.

14. The method of claim 13, further comprising:

performing at least one of the following steps for detecting a short circuit and/or a crosstalk:

inputting a first signal at the first status signal connection, inputting a second signal at the second status signal connection, analyzing a signal status at the first status signal connection, analyzing a signal status at the second status signal connection, and/or comparing a signal status at the first status signal connection and the second status signal connection.

* * * * *